(12) United States Patent
Rjimati et al.

(10) Patent No.: US 7,506,278 B1
(45) Date of Patent: Mar. 17, 2009

(54) METHOD AND APPARATUS FOR IMPROVING MULTIPLEXER IMPLEMENTATION ON INTEGRATED CIRCUITS

(75) Inventors: Yassine Rjimati, Grenoble (FR); David Nguyen Van Mau, Grenoble (FR)

(73) Assignee: XILINX, Inc., San Jose, CA (US)

( * ) Notice: Subject to any disclaimer, the term of this patent is extended or adjusted under 35 U.S.C. 154(b) by 325 days.

(21) Appl. No.: 11/074,956

(22) Filed: Mar. 8, 2005

(51) Int. Cl.
*G06F 17/50* (2006.01)
(52) U.S. Cl. .................. 716/3; 716/2; 716/7; 716/18
(58) Field of Classification Search ............... 716/1, 716/2, 3, 7–10, 18
See application file for complete search history.

(56) References Cited

U.S. PATENT DOCUMENTS

| | | | |
|---|---|---|---|
| 5,748,486 A | 5/1998 | Ashar et al. | |
| 5,754,824 A | 5/1998 | Damiano | |
| 5,872,716 A * | 2/1999 | Yano et al. ..................... | 716/1 |
| 5,923,189 A * | 7/1999 | Sasaki et al. ................ | 326/113 |
| 6,021,266 A * | 2/2000 | Kay ............................. | 716/2 |
| 6,247,108 B1 | 6/2001 | Long | |
| 6,389,374 B1 | 5/2002 | Jain et al. | |
| 6,560,758 B1 | 5/2003 | Jain | |
| 6,609,234 B2 | 8/2003 | Kurupati | |
| 7,171,636 B2 * | 1/2007 | Sako .............................. | 716/3 |
| 2003/0198343 A1 * | 10/2003 | Morioka et al. ............... | 380/37 |

OTHER PUBLICATIONS

Congguang Yang et al.; "BDS: A BDD-Based Logic Optimization System"; DAC,2000; pp. 1-6.
Shashidhar Thakur et al.; "Delay Minimal Decomposition of Multiplexers in Technology Mapping"; 33rd Design Automation Conference; 1966 ACM, Inc.; pp. 1-4.
Rajeev Murgai et al.; "An Improved Synthesis Algorithm for Multiplexor-Based PGA's"; 29th ACM/IEEE Design Automation Conference; 1992 IEEE; Paper 23.4; pp. 380-386.
Rajeev Murgai et al.; "Logic Synthesis for Programmable Gate Arrays"; 27th ACM/IEEE Design Automation Conference; 1990 IEEE; Paper 37.4; pp. 620-625.
Kevin Karplus; "Amap: a Technology Mapper for Selector-Based Field-Programmable Gate Arrays"; 28th ACM/IEEE Design Automation Conference; 1991 ACM; Paper 15.4; pp. 244-247.
Subhasish Mitra et al.; Technical Report; "Efficient Multiplexer Synthesis"; Center for Reliable Computing; Dept. of Electrical Engineering and Computer Science, Stanford University, Stanford, CA; pp. 1-25, no date.

* cited by examiner

*Primary Examiner*—Vuthe Siek
(74) *Attorney, Agent, or Firm*—Mark R. Ascolese; W. Eric Webostad

(57) ABSTRACT

Systems, methods, software, and techniques implementing a multiplexer mapper tool can be used to construct a binary decision diagram (BDD) or related structure representing a series of dependent multiplexers. Once in this form, the BDD can be manipulated in a variety of ways including reordering of nodes according to multiplexer selector and minimizing the BDD using conventional techniques. Once properly processed, the BDD can be further separated into smaller BDDs and mapped to existing cell library design elements.

18 Claims, 5 Drawing Sheets

METHOD AND APPARATUS FOR IMPROVING MULTIPLEXER IMPLEMENTATION ON INTEGRATED CIRCUITS

TECHNICAL FIELD

The present invention relates to programmable logic devices (PLDs) and in particular to multiplexer synthesis for PLDs.

BACKGROUND

Programmable logic devices (PLDs), programmable logic arrays (PLAs), complex programmable logic devices (CPLDs), and field programmable gate arrays (FPGAs), (collectively referred to herein as "PLDs") are well known devices that can be programmed by a user to implement user-defined logic functions. PLDs, as described and claimed in numerous patents assigned to Xilinx, Inc., assignee of the present invention, allow a user to configure and reconfigure the programmable elements on the PLD to implement various logic functions. Because of this versatility, the functionality implemented on a PLD can be updated as improvements in design and efficiency occur, without requiring new silicon. In general, a PLD can be reconfigured with an improved design, instead of designing a new device.

The design flow for PLDs typically includes a number of steps. A user prepares a circuit design using design entry tools such as a schematic capture tool or using a hardware description language (HDL), such as VHDL or Verilog. Particularly for more complex designs, HDLs are used to describe the architecture and behavior of discrete electronic systems. Once established, the circuit design is typically verified through simulation, e.g., behavioral simulation, to confirm that the circuit functions as intended. Further refinement and/or correction of the circuit design often results from this verification process.

The circuit design is then processed by a synthesis tool. The synthesis tool transforms the input design specification into a netlist which specifies the components of the design and the connectivity (signals) between the components. In the case of HDL based circuit designs, the synthesis tool converts the HDL code into a gate level implementation, optimizing the logic automatically for circuit size and speed. Further simulation can be performed at this point as part of the overall design verification process.

Next, the synthesized design is implemented. The implementation process can use a variety of tools such as structure analysis tools, place-and-route tools, etc. For example, a place-and-route tool can generate physical implementation data based on the input netlist and derived structure information. The implementation data specify specific resources that must be built or configured on the target device in order to implement the circuit design. The place-and-route tool can use the derived structure information to generate an improved placement. The design implementation process can take advantage of additional verification techniques. For example, functional simulation, static timing analysis, and timing simulation can all be used to analyze and refine the circuit. Once the design is implemented, a PLD device can be programmed based on the design.

One important part of the design synthesis process is to identify various circuit structures and logic elements in the circuit design and associate such structures and elements with pre-defined elements designed specifically for the target PLD architecture. This process of recognizing or inferring device primitives and macros allows a circuit designer to take advantage of design elements optimized for the particular PLD architecture without having to know detailed information about the best way to configure the basic logic blocks of the PLD. PLD manufacturers typically define various design elements that can be used by circuit designers including primitives (e.g., basic logical elements such as two input AND gates and two input OR gates), soft macros (e.g., schematics made by combining primitives and sometimes other soft macros), and relationally placed macros (RPMs) (e.g., soft macros that contain relative location constraint information, carry logic symbols, etc.). Note that the pre-defined elements designed for one or more target PLD architectures are variously referred to as "design elements" and "circuit design elements" in the present application.

Because any particular portion of the circuit design can be implemented in numerous logically equivalent ways, the synthesis process also aims to select the most appropriate (e.g., efficient, smallest, fastest, etc.) design elements with which to implement the design. The techniques used for such selection often depend on the type of logic device being used.

For example, circuits usually contain a large number of multiplexers. This is especially true for circuits that are automatically synthesized from high-level descriptions. Multiplexers exist in the datapaths of circuits where they are used to provide multiple connections between computation units. For example, multiplexers are typically used for routing the operands to the operators in the datapath. In CAD tools for high-level synthesis, multiplexers are also used to enable register sharing among several variables having non-overlapping lifetimes. During synthesis, multiplexers are often generated corresponding to the if-then-else and case statements present in HDL design descriptions. Moreover, cell libraries often contain various different choices of multiplexers, such as multiplexers with varying numbers of inputs and selectors, multiplexers having differences in physical implementation (e.g., passgate implementations, AND/OR gate implementations, etc.), and even circuits having equivalent functionality (e.g., lookup tables (LUTs)).

Accordingly, it is desirable to have systems, methods, software, and techniques for efficiently mapping multiplexers present in circuit designs to the various PLD design elements available for a particular PLD architecture.

SUMMARY

Systems, methods, software, and techniques implementing a multiplexer mapper tool can be used to construct a binary decision diagram (BDD) or related structure representing a series of dependent multiplexers. Once in this form, the BDD can be manipulated in a variety of ways including reordering of nodes according to multiplexer selector and minimizing the BDD using conventional techniques. Once properly processed, the BDD can be further separated into smaller BDDs and mapped to existing cell library design elements.

Accordingly, one aspect of the present invention provides a method. A plurality of dependent multiplexers present in a circuit design are identified. A binary decision diagram is formed and stored in a data structure. The binary decision diagram includes a plurality of nodes and represents the plurality of dependent multiplexers. A location of at least one of the plurality of nodes is arranged in the binary decision diagram according to information corresponding to a multiplexer selector. The binary decision diagram is mapped to at least one circuit design element.

Another aspect of the present invention provides a system including a memory, a processor coupled to the memory, and a multiplexer mapping tool. At least a portion of the multiplexer mapping tool is encoded as instructions stored in the memory and executable on the processor. The multiplexer mapping tool is configured to: identify a plurality of dependent multiplexers present in a circuit design; forming a binary decision diagram including a plurality of nodes and representing the plurality of dependent multiplexers; and map the binary decision diagram to at least one circuit design element.

Another aspect of the present invention provides an apparatus including: a means for identifying a plurality of dependent multiplexers present in a circuit design; a means for forming a binary decision diagram, wherein the binary decision diagram includes a plurality of nodes and represents the plurality of dependent multiplexers; a means for arranging a location of at least one of the plurality of nodes in the binary decision diagram according to information corresponding to a multiplexer selector; and a means for mapping the binary decision diagram to at least one circuit design element.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following sets forth a detailed description of at least the best contemplated mode for carrying out the one or more devices and/or processes described herein. The description is intended to be illustrative and should not be taken to be limiting.

The systems, methods, software, and techniques described herein for efficiently mapping multiplexers in designs to various available PLD design elements, will focus on implementations using circuit design synthesis tools. An example of such a synthesis tool is the Xilinx® Synthesis Technology (XST) tool. The XST tool is part of Xilinx's® Integrated Software Environment (ISE) design software suite.

XST is a tool that synthesizes HDL designs to create netlist files specific to various Xilinx® devices. XST generates a netlist that contains both logical design data and constraints that takes the place of traditional both electronic design interchange format (EDIF) and netlist constraints file (NCF) files. XST supports various HDL languages, supports various design constraints, and uses various design optimization and coding techniques to synthesize circuit designs using pre-defined primitives and macros. During a typical execution of XST, the tool first tries to recognize (infer) as many macros as possible. Then the macros are passed to a low level optimization step, either preserved as separate blocks or merged with surrounded logic in order to get better optimization results.

Numerous other synthesis tools, e.g., LeonardoSpectrum from Mentor Graphics Corporation and Synplify from Synplicity Inc., will be well known to those having ordinary skill in the art. In general, the systems, methods, software, and techniques described herein can be used with any synthesis tool, or can be embodied in separate software tools.

Figure 1:
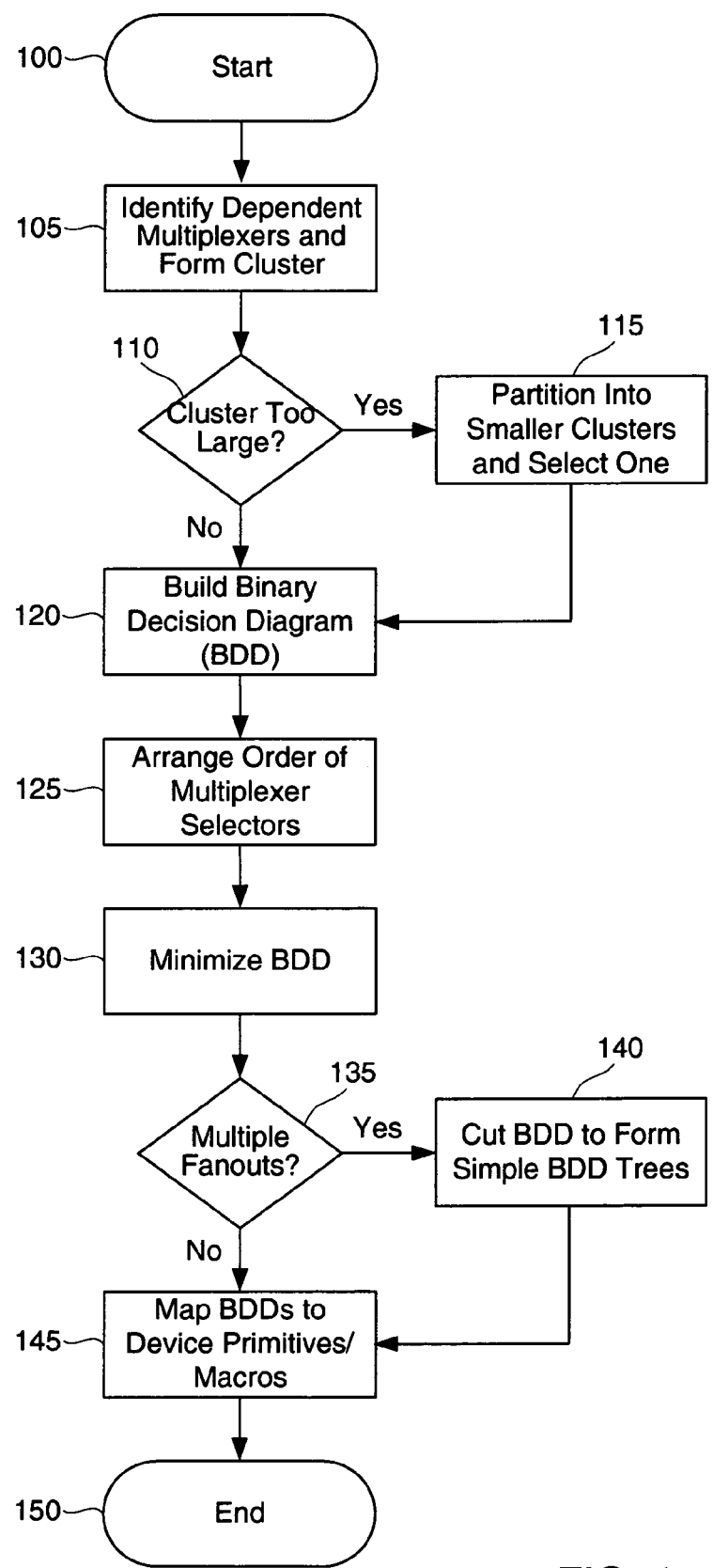
FIG. 1 is a simplified flow diagram illustrating some techniques of the present invention.

FIG. 1 is a simplified flow diagram illustrating a process for mapping multiplexers present in a circuit design to the various PLD design elements available for a particular PLD architecture. Note that this same process can generally be implemented where the design elements available are for a family of PLD devices, or even for generic devices where the basic characteristics of the primitives and macros to which the design will be mapped are sufficiently well defined.

Operation begins at 100, where the circuit design is already established, typically using an HDL. In general, the multiplexer mapping process described in the present invention operates on an HDL circuit description. If the circuit design is established in some other form, e.g., using a schematic capture program or a state diagram capture program, then it may be necessary to translate the circuit description into a format more accessible to the synthesis process, such as an HDL. In other embodiments, the multiplexer mapping process operates on other forms of circuit design description such as a netlist.

In some embodiments, operation may begin after an HDL module has been selected. For example, in Verilog a design component is represented by a module. The connections between components are specified within module instantiation statements. Such statements specify an instance of a module, and each module instantiation statement is given a name (instance name). In addition to the name, a module instantiation statement contains an association list that specifies which actual nets or ports are associated with which local ports of the module declaration. Thus, where a design includes multiple modules, the process illustrated in FIG. 1 can be applied to modules individually, or in some cases multiple modules at the same time.

As shown in 105, dependent multiplexers present in the circuit design are identified and used to form a multiplexer cluster. Dependent multiplexers are multiplexers that share one or more inputs (e.g., multiplexers 201 and 205 in FIG. 2A) and/or possess a precedence relationship, i.e., where the output of one multiplexer is an input to another multiplexer. Since multiplexer structures are well defined by HDLs, this process will typically include analyzing the HDL code describing the circuit design for known terms and labels used to represent multiplexers. Thus, multiplexers can be explicitly instantiated in the HDL description, or may be implicitly specified through the use of if-then-else and case statements. In still other examples, a given circuit description is reduced to a set of Boolean equations which can then be examined for multiplexer functionality. As part of the clusterizing process, larger multiplexers (e.g., 4-to-1 multiplexers, 8-to-1 multiplexers, 16-to-1 multiplexers, etc.) can be reduced to groups of smaller multiplexers that provide logically equivalent functionality. In one example, larger multiplexers are reduced to groups of 2-to-1 multiplexers, i.e., the most basic component multiplexers.

In some synthesis tools, many library design components (e.g., components selected from a library of parameterized modules (LPM) such as LPM multiplexers, adders, etc.) are initially represented as "black boxes". The purpose of a macro generation operation is to transform those black boxes into a corresponding netlist. Thus, for example, operation 105 can include computing each black box into a topological order to eventually propagate optimizations of that black box to other black boxes. During this processing, the use clustering algorithm puts strongly connected black boxes into the same cluster.

Although not separately shown, the operation illustrated in 105 can include the further step of forming a multiplexer tree data structure from the identified cluster of dependent multiplexers. In a typical multiplexer tree, each node represents a 2-to-1 multiplexer. The multiplexers, their data inputs, outputs, and the interconnection signals form a tree topology. Each node of the tree, which has multiple inputs and a single output, represents a multiplexer. Each input of a node corresponds to a multiplexer data input. The output of a node corresponds to a multiplexer output. An edge in the graph represents a net connecting a multiplexer output to a multiplexer data input, a primary input, or the primary output of the multiplexer tree.

In some cases, further simplification is possible because the circuit design specifies constant logic values presented at one or more of the input terminals and the selector terminals. Thus, instead of representing the node as a 2-to-1 multiplexer, the node can in some cases be represented as a binary variable or a binary constant. More specifically, a binary variable can represent the leaf of a mux-tree as well as constant values.

For example, a binary variable can represent a 2-to-1 multiplexer with constant inputs and a variable selector. This simplification is also useful because the input from such multiplexers can come from circuit glue logic, and so representing the multiplexer as a binary variable can be a convenient mechanism to identify whether the corresponding glue logic can be packed with the multiplexer for the purposes of more efficient mapping to design elements pre-defined in the available library. For two input signals A and B multiplexed by selector S, if both A and B are implemented using, for example, lookup table (LUT) design elements, then it may be possible and more efficient to implement the target multiplexer together with A and B using another design element, e.g., a specialized version of the MUXF5 described below. In some embodiments, the aforementioned larger multiplexer reduction process can be implemented as part of multiplexer tree formation instead of the clusterizing process.

The process illustrated in step 105 typically occurs at the module or user-block level. In other embodiments, identification and formation of the cluster can follow multiplexer dependence across two or more modules/user-blocks.

In step 110, the multiplexer cluster is tested to determine if it is too large, or otherwise exceeds some user defined cost function. In general, this test is performed for one or more of the following reasons: clusters that are too large may consume greater computing resources (e.g., memory, processing time, etc.) than are available and/or desirable; clusters that are too large may exacerbate inefficiencies in the overall algorithm; clusters that are too large may cause sub-optimal mapping to cell library primitives and macros (e.g., under simplification or over simplification of the dependent multiplexer cluster, inefficient area mapping, etc.); and the like. The actual test used in 110 can take a variety of different forms. For example, a simple test can just examine the number of multiplexers present in the cluster or tree. More advanced tests can consider other parameters such as cluster/tree depth, cluster/tree breadth, node type (e.g., 2-to-1 multiplexer, binary variable, binary constant), the number of fanins (selector and/or input), and the number of fanouts. Still other suitable tests will be known to those having ordinary skill in the art.

If it is determined in 110 that the multiplexer cluster or tree is too large, operation transitions to 115 where the cluster or tree is partitioned into two or more smaller clusters. One of the new smaller clusters is selected for further processing, and operation proceeds to 120. In general, a variety of different techniques can be used to partition a single cluster or tree into multiple smaller clusters/trees. In one embodiment, clusters are partitioned using depth and/or breadth parameters. For example, multiplexer cluster 200 in FIG. 2A can be partitioned by cutting the cluster between the level of multiplexer 215 and the level of multiplexers 213 and 214 (i.e., based on simple level depth analysis). Such a partition operation yields three smaller clusters: the trivial cluster formed by multiplexer 215, and two other clusters formed by multiplexers 201-204, 209, 210, 213, and multiplexers 205-208, 211, 212, 214, respectively. More advanced partitioning techniques can factor in additional multiplexer information such as fanins and fanouts. Still other partition techniques will be known to those having skill in the art.

Operation 115 can seek out portions of a cluster that are particularly complex or pose some potential simplification concern, and target those portions for isolation into separate clusters or attempt to partition the cluster at those locations. Take, for example, a cluster containing multiplexers MUX1 and MUX2 where the variables (input signals) of MUX1 are also the selectors of MUX2. The representation schemes described below (e.g., binary decision diagrams) are a convenient way to represent a multiplexer when the variables of a selector are prior to the variables of an input. However, it becomes much more difficult to represent multiplexers using these techniques if the inputs are prior to the selector, as in the example of MUX1 and MUX2. For example, a 4-to-1 multiplexer with 2 selectors uses 7 ROBDD (see below) nodes when the selectors are prior to inputs. If that is not the case, then it may take as many as 27 (or more) nodes to represent the multiplexer. Thus, if certain clusters are not split, computation can be further complicated and resulting multiplexer analysis may be suboptimal.

In implementations where a single cluster is partitioned into multiple clusters, additional steps (not shown) can be included to ensure that each cluster formed in the partitioning operation is processed using the complete multiplexer mapping procedure. As illustrated in FIG. 1, if the cluster examined in step 110 is not found to be too large, operation proceeds to 120.

While the multiplexer cluster or tree derived from the circuit design provides a complete description of the multiplexers to be analyzed, it does not provide a form that is easy to manipulate. For further analysis of the dependent multiplexers, it is useful to transform the information in the cluster or tree into a Boolean function. In general, a Boolean function is a mapping that gives a Boolean value for a given combination of input values. Various representations of Boolean functions are possible, including Boolean equations, truth tables, and binary decision diagrams (BDDs). Step 120 constructs a BDD from the multiplexer cluster/tree data. In general, BDDs, there various forms, techniques for generating BDDs, and some techniques for manipulating BDDs are known by those having ordinary skill in the art.

A BDD represents a Boolean function as a rooted, directed acyclic graph. The branching graph represents a combination of input values leading to an output value, with each nonterminal node or vertex representing an input variable and each edge representing the value of the given variable. Thus, each nonterminal vertex is typically labeled by a variable and has edges directed toward two children: one along a "low" edge corresponding to the case where the variable is assigned 0, and one along a "high" edge corresponding to the case where the variable is assigned 1. Each terminal vertex is labeled 0 or 1. For a given assignment to the variables, the value yielded by the function is determined by tracing a path from the root to a terminal vertex, following the branches indicated by the values assigned to the variables. The function value is then given by the terminal vertex label.

For so-called ordered BDDs (OBDDs) an order is imposed on the Boolean variables. The ordering requires that for any vertex u, and nonterminal child v, their respective variables must be ordered var(u)<var(v). Thus, in an OBDD, every source to sink path in the OBDD visits the input variable in the same order. In principle, the variable ordering can be selected arbitrarily because algorithms for manipulating BDDs will operate correctly for any ordering. However, selecting a satisfactory ordering is typically very important for the efficient symbolic manipulation, because the form and size of a BDD depends on variable ordering.

Although careful selection of variable ordering can yield relatively compact OBDDs, additional transformations can be performed on OBDDs (or BDDs generally) to yield greater size reduction. Three transformations are applied to an OBDD to produce a reduced ordered binary decision diagram (ROBDD): (1) Remove Duplicate Terminals: Eliminate all but one terminal vertex with a given label and redirect all edges into the eliminated vertices to the remaining one; (2) Remove Duplicate Nonterminals: If nonterminal vertices u and v have var(u)=var(v), lo(u)=lo(v), and hi(u)=hi(v), then eliminate one of the two vertices and redirect all incoming edges to the other vertex; (3) Remove Redundant Tests: If nonterminal vertex v has lo(v)=hi(v), then eliminate v and redirect all incoming edges to lo(v). Thus, nodes in an OBBD can be eliminated via node sharing and by removing redundant nodes.

In addition to being compact, ROBDDs represent a canonical form. Thus, for a given Boolean function and for a fixed ordering, there exists a single unique ROBDD. While many different Boolean equations can represent a single Boolean function, the fixed ordered ROBDD for a given Boolean function is unique. This property allows for a variety of different types of ROBDD manipulation.

Throughout this application, the term BDD is used in its most general sense. Thus, BDDs include OBDDs, ROBDDs, and other specialized and/or equivalent forms of BDDs. Consequently, although the flow chart in FIG. 1 refers to BDDs in several operations, various different types of BDDs can be used in the steps illustrated.

Step 120 can be performed using the multiplexer cluster/tree itself (i.e., the BDD can be constructed directly from a cluster/tree). In another embodiment, 120 includes the additional operation of obtaining a symbolic form Boolean equation based on the cluster or tree of dependent multiplexers. This Boolean equation is then used to construct the BDD. Moreover, various techniques exist (and are well known to those having ordinary skill in the art) to construct specialized BDD forms (e.g., ROBDDs and OBDDs) directly from Boolean equations. BDDs are particularly useful for describing multiplexer clusters because the BDD vertex corresponds to a 2-to-1 multiplexer, i.e., the function at each node of the cluster is represented as a BDD in terms of its immediate fanins.

In still other embodiments, structures related to BDDs can be used. For example, if-then-else directed acyclic diagrams (ITE DAGs) can be used and are, in some sense, a generalization of BDDs. In an ITE-DAG, the selector function at each vertex can be a function of inputs, rather than being an input. There are three children of an ITE-DAG vertex: if, then, and else. The if child corresponds to the select line of the multiplexer. The then and else children correspond to the branches taken when the if child evaluates to 1 and 0 respectively. Still other DAG structures will be known to those having ordinary skill in the art.

Software implementation of the data structures used to represent BDDs and the procedures used to build and manipulate BDDs are typically found in a BDD package. Functionality typically provided by such BDD packages includes: conversion of the description of some Boolean function in an external format into a BDD of the desired format; combination of available functions to create new functions (e.g., using operators such as AND, OR, XOR, etc.); additional procedures to re-order and manipulate nodes of the BDD, and conversion of the BDD into a suitable external format. Some specific operations will be discussed in greater detail below, but examples of BDD packages include: CUDD: The Colorado University CU Decision Diagram Package, Release 2.4.0, provided by Fabio Somenzi; and BuDDy—a BDD library developed by Jøorn Lind-Nielsen. Numerous other BDD packages exist and can be utilized in the present invention, or specialized BDD routines can be developed.

Because of the complexity of multiplexer implementations, simply obtaining an ROBDD of a dependent multiplexer cluster is rarely enough for efficient technology mapping, i.e., mapping the multiplexer cluster to a cell library of primitives and macros. Thus, additional processing of the BDD is typically performed. Once the BDD has been formed, various operations are preformed to reorder multiplexer nodes based on properties of the multiplexer selectors (125). Reordering based on selector properties can provide further mapping advantages related to balancing multiplexer path lengths, area reduction, and matching with cell library primitives and macros.

For example, certain multiplexer nodes can be rearranged to push more important selectors toward the bottom of the multiplexer cluster representation. Step 125 can use the order of selectors as described in the HDL for the circuit design as an indication of selector order preference. In such an example, the assumption is that the user who prepared the circuit design usually knows the most critical selectors and arranges the design accordingly. In an alternate embodiment, nodes can be relocated to accommodate known or estimated signal delays associated with selectors. For example, if first selector is known or estimated to have a selector signal that will be delayed with respect to another selector signal, the first selector can be pushed closer to the root of the multiplexer cluster.

Additionally, selectors can be arranged in topological order. A selector that also drives an input terminal to a multiplexer is often better located at the top of the multiplexer cluster. This might be to provide more efficient mapping to a primitive or macro. For example, such a multiplexer could more easily be mapped to a look-up table (LUT) library structure requiring only lest input. Selectors can also be rearranged according to the number of fanouts associated with the selector. For example, if a selector has many outputs, pushing it to the bottom of a multiplexer cluster effectively reduces the total number of inputs driven by the selector, which can provide timing, speed, and/or power advantages in the final circuit implementation. For large fanout selectors, it may be generally preferable to push them toward the top. If power consumption is a concern, the most active selector(s) can be pushed to the bottom. Selector reordering can also be driven by concerns about associated logic. For example, certain glue logic elements associated with multiplexers may already be placed by a placer. If that glue logic placement introduces certain distances between each glue logic output and the multiplexer it feeds, and those distances are greater than desired, reordering the multiplexer selectors can reduce these distances and therefore optimize the delay from the glue logic to the output of the multiplexer. Still other selector based rearrangement techniques can be implemented.

Next, operation transitions to 130 where any additional BDD minimization/optimization can occur. In this case, functions available in the implemented BDD package are typically used to try to further reduce the size of the BDD representing the multiplexer cluster. In this regard, the aforementioned CUDD BDD package provides numerous examples of variable reordering methods that can be applied to the BDD in an effort to find more compact BDDs:

CUDD_REORDER_RANDOM: Pairs of variables are randomly chosen, and swapped in order. The swap is performed by a series of swaps of adjacent variables. The best order among those obtained by the series of swaps is retained.

CUDD_REORDER_SIFT: A sifting algorithm picks one variable and shifts it gradually to the last position of the order and then again upwards to the top position of the ordering leaving all other variables fixed at their positions. The downwards and upwards shifts are performed by repeated variable swaps with the adjacent lower or upper variable. The best position of the variable is recorded, and after all shifts have been tried the variable is placed at its optimal position by downward shifts. The procedure is repeated for every variable of the function.

CUDD_REORDER_WINDOW2: This method iterates (once or several times) over all variable levels of the BDD and tries to find for each level i the best permutation of the variables $x_i; x_{i+1} \ldots x_{i+k}$ where k is called the window size (in this case 2). Similar methods also exist for other window sizes.

Numerous other methods for dynamic variable reordering are available in the CUDD BDD package. Other BDD packages implement various different variable reordering techniques, and still other reordering techniques are known to those having ordinary skill in the art.

In some embodiments, the BDD formed (e.g., an ROBDD) is further transformed into more specialized DAG structure. For example, if one of the aforementioned BDD packages are used in this process, it may be impractical (e.g., no access to package source code) to modify the existing package to suit all of the multiplexer optimization process's needs. Consequently, once the ROBDD is optimized, additional information may need to be attached to the nodes, and this can be done to nodes of a new DAG built from the ROBDD, i.e., an ROBDD DAG. Such a structure can be convenient to use, for example, where some methods are needed to link a ROBDD node with all its destinations, but the BDD package does not provide those methods. Although not shown in FIG. 1, a BDD to BDD DAG transformation operation can be integrated into the process at a variety of different points. For example, such a transformation can be performed between steps 125 and 130.

In other embodiments step 125 can be broken into two separate steps (not shown): a multiplexer selector preorder step performed before building of the BDD DAG, and a multiplexer selector reordering step after BDD DAG minimization. In still a further variation of these embodiments, building the initial BDD (e.g., an ROBDD) and transforming that it into a BDD DAG are both performed after a multiplexer selector preorder step. Note that the efficiency of BDD optimizations is generally linked with the initial size of the BDD (or BDD DAG). If a first solution is too far from the optimal solution, then the minimization process may find a local minima and stay stuck in it. Consequently, it is desirable to find a good order for the variables of the BDD before to build the BDD DAG is built.

While the BDD to BDD DAG transformation can be desirable or necessary, it may also pose additional problems to be overcome. For example, in an ROBDD DAG structure regular and inverted nodes are almost identical. The polarity of a node is represented by the branch that comes to the node. So in a primitive view, an inverter that occurs between a MUXF5 and a MUXF6 breaks the packing rules between those two multiplexers. Thus, a separate function can be employed to "push" inverters onto the BDD DAG to resolve this issue.

In step 135 a test is performed to determine whether multiplexer selectors in the BDD have multiple fanouts. If selectors have multiple fanouts as determined in 135, operation transitions to 140 where the BDD is cut at the fanout points to form multiple, simpler BDD trees. In general, the extra fanouts complicate the BDD. For example, if the extra fanout (EF) is on selector S2, then the fanout of the net for S2 will be $EF+2^n$ where n is the depth of S2 in the selector ordered list. Therefore, to reduce the fanout of S2, it is placed as close as possible to the tree output. When the output of a multiplexer node has a multiple fanout, it is desirable to cut it for better matching with design element primitives and macros. Operation then proceeds to 145. If there are no selectors with multiple fanouts, operation proceeds to 145.

The remaining BDDs (or BDD DAGs) are mapped to device primitives and macros using traditional mapping techniques (145). As noted above, this mapping process will typically target specific primitives and macros available in the PLD. For example, where the target PLD device is among the Xilinx family of devices, libraries of numerous design elements exist and step 145 maps BDDs to those design elements. In the Xilinx design libraries, design elements particularly relevant to multiplexer mapping include:

LUT1, 2, 3, 4: LUT1, LUT2, LUT3, and LUT4 are, respectively, 1-, 2-, 3-, and 4-bit look-up-tables (LUTs) with general output (O).

M2_1: A generalized 2 to 1 multiplexer that chooses one data bit from two sources (D1 or D0) under the control of the select input (S0). The output (O) reflects the state of the selected data input. When Low, S0 selects D0 and when High, S0 selects D1.

MUXCY: A generalized 2 to 1 multiplexer for carry logic, e.g., used to implement a 1-bit high-speed carry propagate function.

MUX5, 6, 7, 8: A 2 to 1 multiplexer for creating a function-of-5, 6, 7, 8 lookup table or a 4-to-1, 8-to-1, 16-to-1, 32-to-1 multiplexer in combination with the associated lookup tables.

These design elements, and the numerous defined variations thereof of merely examples of the types of pre-defined primitives and macros that are typically provided by PLD manufacturers and available for use by synthesis tools. Numerous other design elements will be known to those having skilled in the art, and will typically vary according to device and/or software provider. In one embodiment, the mapping operation involves searching for matches between each of the BDDs derived from the design and predefined BDDs that represent various available design elements. In another embodiment, the mapping process involves filtering the derived BDDs based on parameters such as number of variables, number of data inputs, number of selectors, etc. Depending on these various parameters, certain design elements are selected from the library of available design elements. Still other technology mapping techniques will be known to those having skill in the art. Once the mapping process is complete, the operation terminates at 150.

Figure 2A:
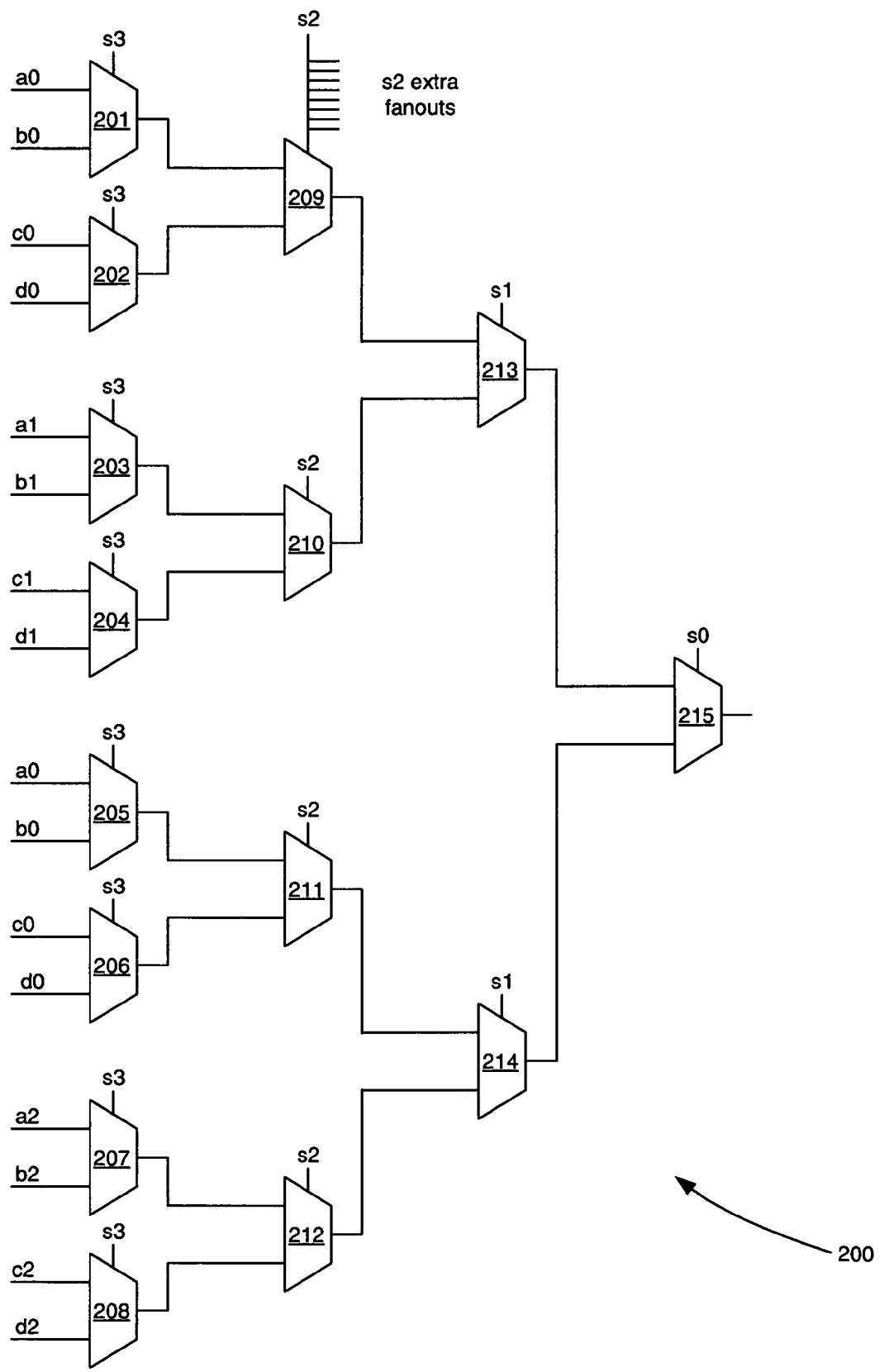
FIGS. 2A-2C illustrate simplified block diagrams of multiplexers processed using the some of the techniques of the present invention.
Figure 2B:
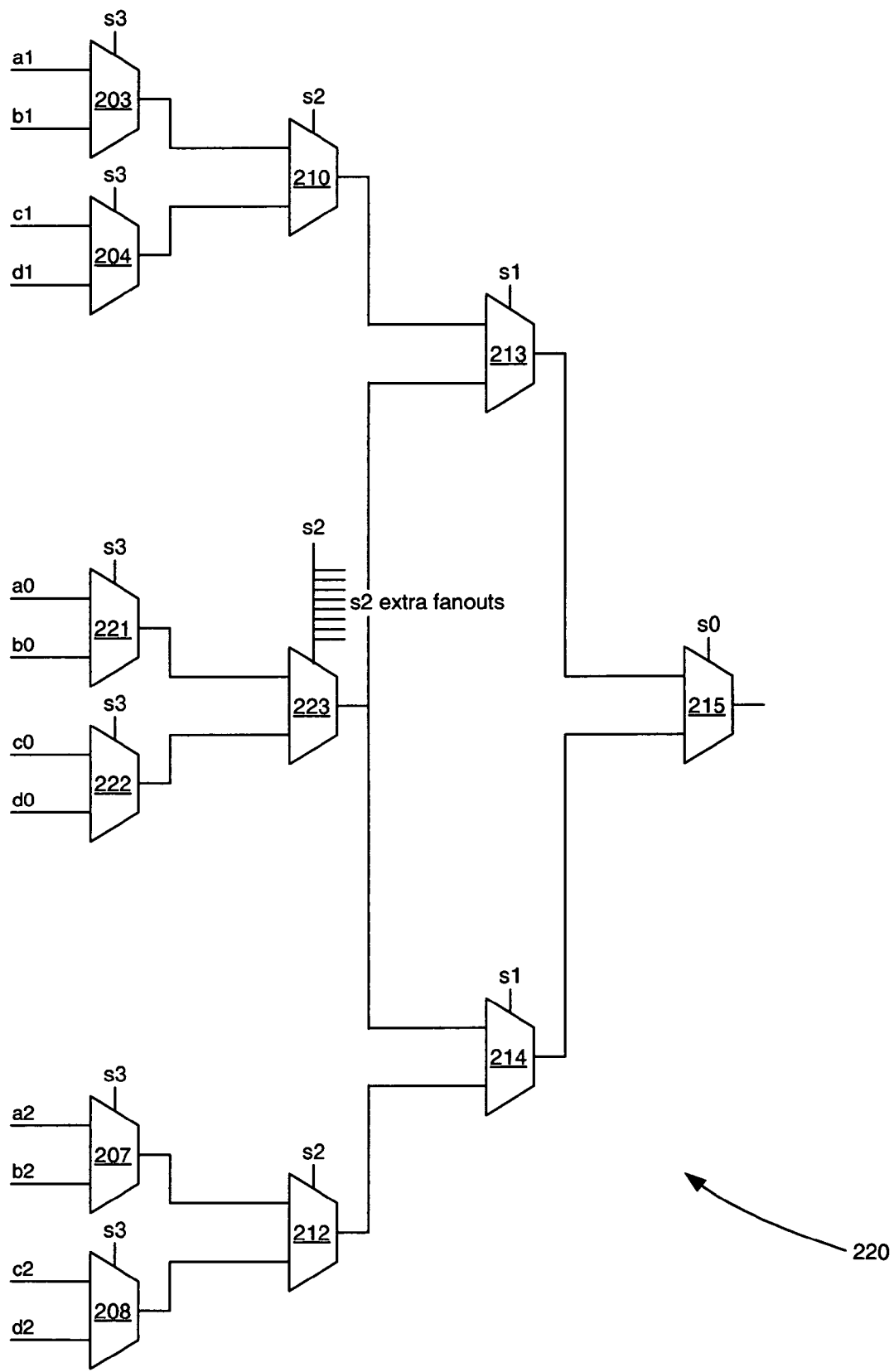
Figure 2C:
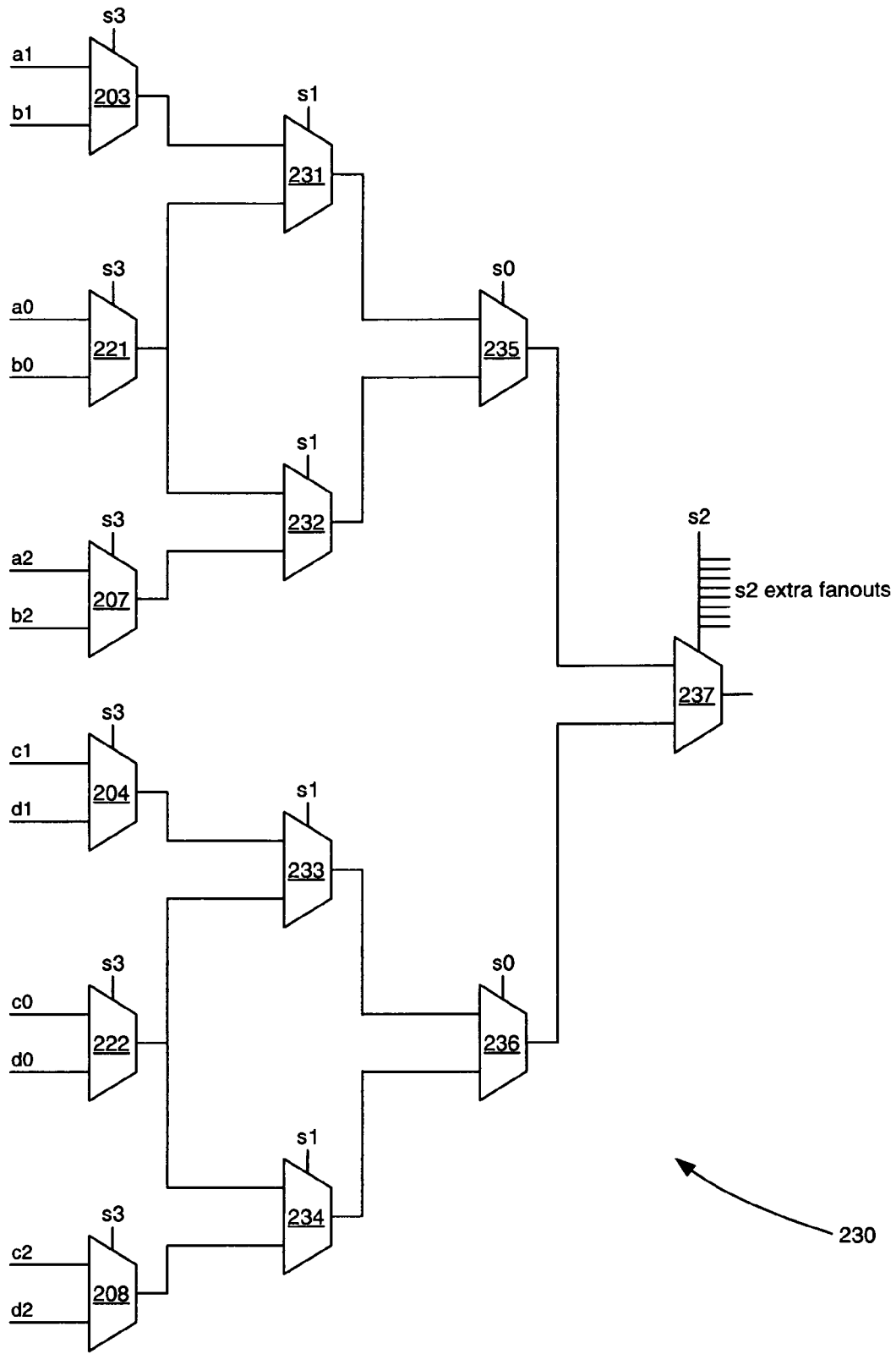

FIGS. 2A-2C illustrate simplified block diagrams of a multiplexer cluster as it is processed using multiplexer mapping tools and techniques such as those described above. FIG. 2A provides an example of a cluster 200 of dependent multiplexers. Multiplexer cluster 200 represents the dependent multiplexers identified from one or more modules or user blocks of a circuit design. Note that the various multiplexers illustrated are dependent in that they share some sort of precedence relation (e.g., the output of multiplexer 201 is an input to multiplexer 209) and/or the multiplexers share input signals (e.g., multiplexer 201 has the same input signals as multiplexer 205). Note also that the multiplexers are arranged in levels according to their selector signal, i.e., the top level of multiplexers (201-208) are all driven by selector signal s3, the next level of multiplexers (209-212) are all driven by selector signal s2, the next level of multiplexers (213 and 214) are all driven by selector signal s1, and the multiplexer 215 in the bottom level of cluster 200 is driven by selector signal s0. FIG. 2A illustrates a relatively simple multiplexer cluster, but numerous different forms of multiplexer clusters can be derived from a circuit design and analyzed. Some clusters may have additional features that potentially make the analysis more complex. For example, the selector of multiplexer 209 is shown as driving several additional fanouts. Numerous other variations will be well known to those having ordinary skill in the art.

FIG. 2B illustrates the multiplexer cluster 220 which represents multiplexer cluster 200 after some processing according to the techniques of the present invention. For example, multiplexer cluster 220 corresponds to an ROBDD derived from the original multiplexer cluster 200. Here, partially equivalent multiplexers have been identified and eliminated. The cluster has also been rearranged as necessary to accommodate the elimination of unnecessary multiplexers. In this case, multiplexers 201, 202, 205, 206, 209, and 211 have been eliminated and replaced with multiplexers 221-223. This is because the subcluster formed by multiplexers 201, 202, and 209 is equivalent to the subcluster formed by multiplexers 205, 206, and 211, i.e., the subclusters have the same input signals and the same multiplexer arrangements. Again, this optimization occurs as part of the formation of the ROBDD, and cluster 220 is merely a multiplexer cluster representation of the simplified logic obtained from the ROBDD.

FIG. 2C illustrates the multiplexer cluster 230 which represents multiplexer cluster 220 after further processing according to the techniques of the present invention. Here, some of the multiplexers have been reordered to push multiplexers with larger numbers of fanouts to the bottom of the cluster. Thus, multiplexer 223 becomes multiplexer 237 when it is relocated to the bottom of multiplexer cluster 230. To accommodate this relocation, multiplexers driven by selector signals s1 and s2 are reordered, yielding a number of new multiplexers as shown in FIG. 2C. Cluster 230 also illustrates a situation where it may be desirable to ultimately have more multiplexers that might otherwise be required. In some embodiments, the multiplexer mapping tool can weight the relative advantages of different cluster configurations and select a final cluster design according to established criteria. In a typical process, multiplexer cluster 230 would potentially be cut at multiple fanout points and then mapped to available design elements.

The flow chart of FIG. 1 illustrates some of the many operational examples of multiplexer mapping techniques disclosed in the present application. Those having ordinary skill in the art will readily recognize that certain steps or operations illustrated in FIG. 1 can be eliminated or taken in an alternate order. Moreover, the methods described in FIG. 1 are typically implemented as one or more software programs encoded in a computer readable medium as instructions executable on a processor. The computer readable medium can be any one of an electronic storage medium, a magnetic storage medium, an optical storage medium, and a communications medium conveying signals encoding the instructions. Separate instances of these programs can be executed on separate devices in keeping with the methods described above. Thus, although certain steps have been described as being performed by certain devices, software programs, processes, or entities, this need not be the case and a variety of alternative implementations will be understood by those having ordinary skill in the art.

Figure 3:
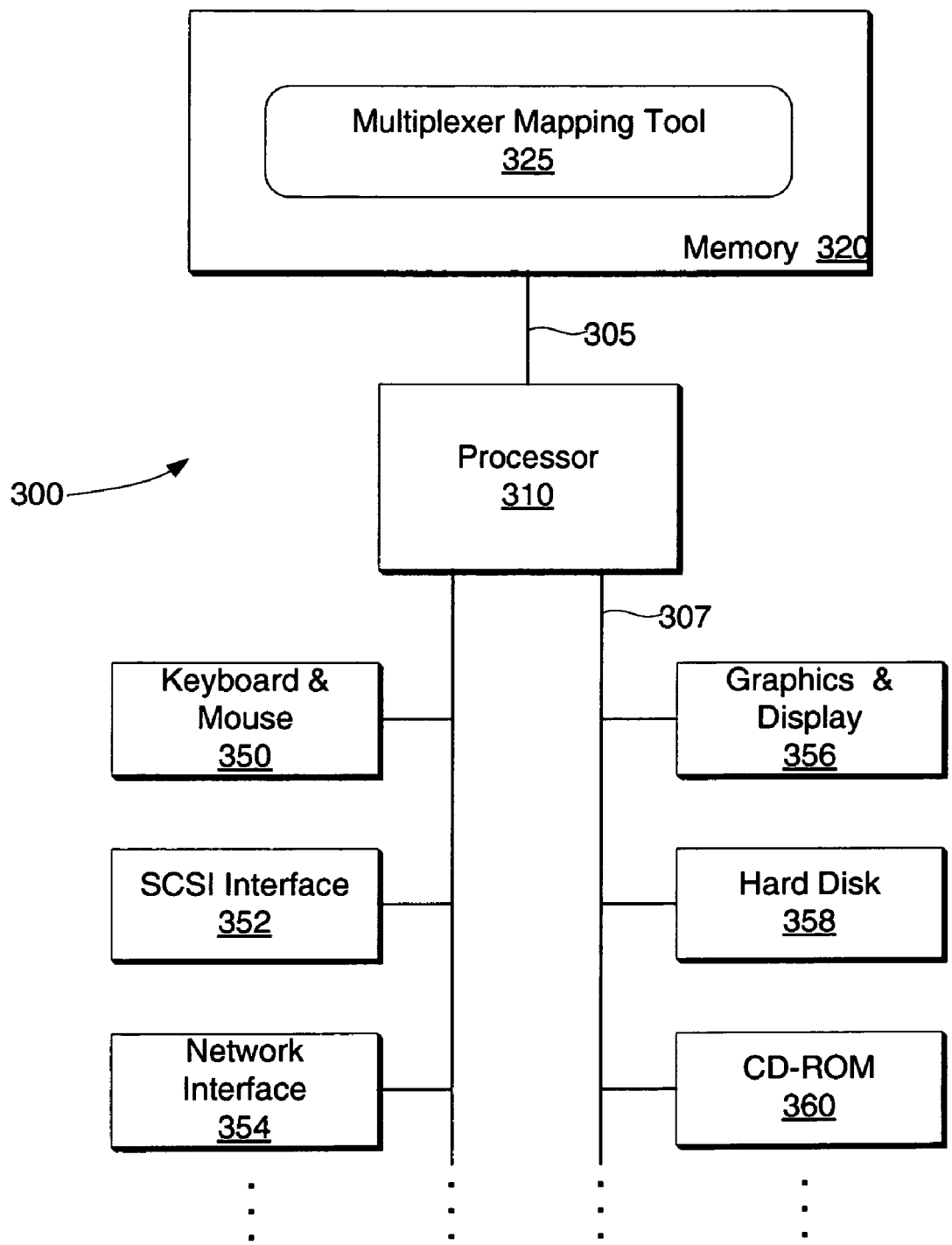
FIG. 3 is a block diagram of a computer system for implementing the techniques of the present invention.

FIG. 3 illustrates a block diagram of a computer system 300 for implementing the techniques for multiplexer mapping of the present invention. For example, computer system 300 is typically an EDA workstation used as part of the circuit design synthesis process. Computer system 300 includes a processor 310 and a memory 320 coupled together by communications bus 305. Processor 310 can be a single processor or a number of individual processors working together. Memory 320 is typically random access memory (RAM), or some other dynamic storage device, and is capable of storing instructions to be executed by the processor, e.g., multiplexer mapping tool 325. Multiplexer mapping tool 325 can be a standalone software tool or part of a larger synthesis tool or package. Memory 320 is also used for storing temporary variables or other intermediate information during the execution of instructions by the processor 310.

Those having ordinary skill in the art will readily recognize that the techniques and methods discussed below can be implemented in software using a variety of computer languages, including, for example, traditional computer languages such as assembly language, Pascal, and C; object oriented languages such as C++, C#, and Java; and scripting languages such as Perl and Tcl/Tk. Additionally, software 325 can be provided to the computer system via a variety of computer readable media including electronic media (e.g., flash memory), magnetic storage media (e.g., hard disk 358, a floppy disk, etc.), optical storage media (e.g., CD-ROM 360), and communications media conveying signals encoding the instructions (e.g., via a network coupled to network interface 354).

Computer system 300 also includes devices such as keyboard & mouse 350, SCSI interface 352, network interface 354, graphics & display 356, hard disk 358, and CD-ROM 360, all of which are coupled to processor 310 by communications bus 307. It will be apparent to those having ordinary skill in the art that computer system 300 can also include numerous elements not shown in the figure, such as additional storage devices, communications devices, input devices, and output devices, as illustrated by the ellipsis shown.

The systems, methods, software, and techniques disclosed herein for efficiently mapping multiplexers in circuit designs to various predefined macros and primitives have emphasized PLD applications. However, those having ordinary skill in the art will readily recognize that the same techniques can be used in synthesizing designs for ASICs (e.g., using standard cells defined by the ASIC manufacturer), general purpose integrated circuits (e.g., microcontrollers and processors), DSPs, and the like. In general, the design and synthesis of any integrated circuit can make use of the systems, methods, software, and techniques described in the present application.

Additionally, while the disclosed devices and techniques have been described in light of the embodiments discussed above, one skilled in the art will also recognize that certain substitutions may be easily made in the circuits without departing from the teachings of this disclosure. For example, a variety of logic gate structures may be substituted for those shown, and still preserve the operation of the circuit, in accordance with DeMorgan's law.

Regarding terminology used herein, it will be appreciated by one skilled in the art that any of several expressions may be equally well used when describing the operation of a circuit including the various signals and nodes within the circuit. Any kind of signal, whether a logic signal or a more general analog signal, takes the physical form of a voltage level (or for some circuit technologies, a current level) of a node within the circuit. Such shorthand phrases for describing circuit operation used herein are more efficient to communicate details of circuit operation, particularly because the schematic diagrams in the figures clearly associate various signal names with the corresponding circuit blocks and node names.

Although the present invention has been described with respect to a specific preferred embodiment thereof, various changes and modifications may be suggested to one skilled in the art and it is intended that the present invention encompass such changes and modifications that fall within the scope of the appended claims.

The invention claimed is:

1. A method comprising:
   identifying a plurality of dependent multiplexers present in a circuit design;
   forming at least one multiplexer cluster from the plurality of dependent multiplexers;
   forming a binary decision diagram stored in a data structure, wherein the binary decision diagram includes a plurality of nodes and represents the at least one multiplexer cluster;
   arranging a location of at least one of the plurality of nodes in the binary decision diagram according to information corresponding to a multiplexer selector;
   transforming the binary decision diagram into a binary decision-directed acyclic hybrid diagram; and
   mapping the hybrid diagram to at least one circuit design element;
   wherein forming a binary decision diagram further comprises:
      forming a reduced ordered binary decision diagram for providing the hybrid diagram;
      determining whether multiple fanouts are present in the hybrid diagram; and
      cutting the hybrid diagram at fanout points responsive to presence of the multiple fanouts therein to form multiple hybrid diagrams that are less complex than the hybrid diagram.

2. The method of claim 1 wherein at least two of the plurality of dependent multiplexers have at least one of a precedence relationship and a common selector.

3. The method of claim 1 wherein the identifying a plurality of dependent multiplexers further comprises:
   parsing the circuit design; and
   configuring the at least one multiplexer cluster with a tree topology.

4. The method of claim 1 wherein the circuit design further comprises at least one of: a hardware description language (HDL) representation, a schematic capture program representation, a state diagram capture program representation, and a Boolean function representation.

5. The method of claim 1 further comprising:
   transforming the binary decision diagram into a reduced ordered binary decision diagram for providing the hybrid diagram;
   determining whether multiple fanouts are present in the hybrid diagram; and
   cutting the hybrid diagram at fanout points responsive to presence of the multiple fanouts therein to form multiple hybrid diagrams that are less complex than the hybrid diagram.

6. The method of claim 1 wherein the arranging a location of at least one of the plurality of nodes in the binary decision diagram further comprises at least one of:
   locating the at least one of the plurality of nodes toward one end of the binary decision diagram;
   arranging the at least one of the plurality of nodes according to an order of selectors as described in the circuit design;
   locating the at least one of the plurality of nodes according to a known or estimated signal delay;
   arranging the at least one of the plurality of nodes in a topological order; and
   arranging the at least one of the plurality of nodes according to a number of fanouts associated with the multiplexer selector.

7. The method of claim 1 further comprising:
   performing a variable reordering operation on the binary decision diagram for providing the hybrid diagram;
   determining whether multiple fanouts are present in the hybrid diagram; and
   cutting the hybrid diagram at fanout points responsive to presence of the multiple fanouts therein to form multiple hybrid diagrams that are less complex than the hybrid diagram.

8. The method of claim 1 wherein the mapping the binary decision diagram further comprises:
   comparing the binary decision diagram to a binary decision diagram representing the at least one circuit design element.

9. The method of claim 1 wherein the at least one circuit design element further comprises at least one of a primitive and a macro describing a circuit implementation in a library of defined circuit implementations and wherein the library of defined circuit implementations corresponds to a programmable logic device (PLD).

10. The method of claim 1 encoded in a computer readable medium, the computer readable medium being a physical storage device, the storage device being one of an electronic storage medium, a magnetic storage medium, and an optical storage medium, instructions being stored thereon that, when executed by a computer, implement the method of claim 1.

11. A system comprising:
   a memory;
   a processor coupled to the memory; and
   a multiplexer mapping tool, wherein at least a portion of the multiplexer mapping tool is encoded as instructions stored in the memory and executable on the processor, and wherein the multiplexer mapping tool is configured to:
      identify a plurality of dependent multiplexers present in a circuit design;
      form at least one multiplexer cluster from the plurality of dependent multiplexers;
      form a binary decision diagram including a plurality of nodes and representing the at least one multiplexer cluster;

transform the binary decision diagram into a binary decision-directed acyclic hybrid diagram;

map the hybrid diagram to at least one circuit design element;

form a reduced ordered binary decision diagram for providing the hybrid diagram;

determine whether multiple fanouts are present in the hybrid diagram;

cut the hybrid diagram at fanout points responsive to presence of the multiple fanouts therein to form multiple hybrid diagrams that are less complex than the hybrid diagram; and map the multiple hybrid diagrams formed therefrom to circuit design elements.

12. The system of claim 11 wherein the multiplexer mapping tool is further configured to:

arrange a location of at least one of the plurality of nodes in the binary decision diagram according to information corresponding to a multiplexer selector.

13. The system of claim 12 wherein the multiplexer mapping tool is further configured to at least one of:

locate the at least one of the plurality of nodes toward one end of the binary decision diagram;

arrange the at least one of the plurality of nodes according to an order of selectors as described in the circuit design;

locate the at least one of the plurality of nodes according to a known or estimated signal delay;

arrange the at least one of the plurality of nodes in a topological order; and arrange the at least one of the plurality of nodes according to a number of fanouts associated with the multiplexer selector.

14. The system of claim 11 wherein the multiplexer mapping tool is further configured to:

transform the binary decision diagram into a reduced ordered binary decision diagram for providing the hybrid diagram;

determine whether multiple fanouts are present in the hybrid diagram;

cut the hybrid diagram at fanout points responsive to presence of the multiple fanouts therein to form multiple hybrid diagrams that are less complex than the hybrid diagram; and map the multiple hybrid diagrams formed therefrom to circuit design elements.

15. The system of claim 11 wherein the multiplexer mapping tool is further configured to:

perform a variable reordering operation on the binary decision diagram for providing the hybrid diagram;

determine whether multiple fanouts are present in the hybrid diagram;

cut the hybrid diagram at fanout points responsive to presence of the multiple fanouts therein to form multiple hybrid diagrams that are less complex than the hybrid diagram; and map the multiple hybrid diagrams formed therefrom to circuit design elements.

16. The system of claim 11 wherein at least two of the plurality of dependent multiplexers have at least one of a precedence relationship and a common selector.

17. The system of claim 11 further comprising:

a library of defined circuit implementations including the at lest one circuit design element, wherein the at least one circuit design element further comprises at least one of a primitive and a macro describing a circuit implementation.

18. An apparatus comprising:

a means for identifying a plurality of dependent multiplexers present in a circuit design;

means for forming at least one multiplexer cluster from the plurality of dependent multiplexers;

a means for forming a binary decision diagram, wherein the binary decision diagram includes a plurality of nodes and represents the at least one multiplexer cluster;

a means for arranging a location of at least one of the plurality of nodes in the binary decision diagram according to information corresponding to a multiplexer selector;

means for transforming the binary decision diagram into a binary decision-directed acyclic hybrid diagram; and a means for mapping the hybrid diagram to at least one circuit design element;

wherein means for forming a binary decision diagram further comprises:

a means for forming a reduced ordered binary decision diagram for providing the hybrid diagram;

a means for determining whether multiple fanouts are present in the hybrid diagram; and a means for cutting the hybrid diagram at fanout points responsive to presence of the multiple fanouts therein to form multiple hybrid diagrams that are less complex than the hybrid diagram.

* * * * *